(12) United States Patent
Aoki et al.

(10) Patent No.: US 11,531,266 B2
(45) Date of Patent: Dec. 20, 2022

(54) IMPRINTING METHOD, IMPRINT APPARATUS, AND ARTICLE MANUFACTURING METHOD

(71) Applicant: CANON KABUSHIKI KAISHA, Tokyo (JP)

(72) Inventors: Akio Aoki, Shimotsuga-gun (JP); Tadashi Hattori, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 83 days.

(21) Appl. No.: 16/936,989

(22) Filed: Jul. 23, 2020

(65) Prior Publication Data
US 2021/0055649 A1 Feb. 25, 2021

(30) Foreign Application Priority Data
Aug. 20, 2019 (JP) .............................. JP2019-150694

(51) Int. Cl.
*G03F 7/00* (2006.01)
(52) U.S. Cl.
CPC .................. *G03F 7/0002* (2013.01)
(58) Field of Classification Search
CPC ...... G03F 7/0002; G03F 7/161; G03F 7/7085; G03F 7/70908; B29C 33/424; H01L 21/027
See application file for complete search history.

(56) References Cited

U.S. PATENT DOCUMENTS

| 8,221,827 | B2 | 7/2012 | Tokue et al. | |
|---|---|---|---|---|
| 2010/0320631 | A1* | 12/2010 | Suzuki | B82Y 10/00 425/169 |
| 2012/0029110 | A1* | 2/2012 | Washiya | G11B 5/855 522/182 |
| 2012/0292799 | A1* | 11/2012 | Mutoh | B82Y 40/00 425/135 |

FOREIGN PATENT DOCUMENTS

| JP | 4660581 B2 | 3/2011 |
|---|---|---|
| JP | 2012146699 A | 8/2012 |
| JP | 2012243805 A | 12/2012 |

\* cited by examiner

*Primary Examiner* — Alexander M Weddle
(74) *Attorney, Agent, or Firm* — Carter, DeLuca & Farrell LLP

(57) ABSTRACT

An imprinting method in which a pattern of an imprint material can be formed on a substrate while damage of a concave and convex pattern of a mold due to foreign particle is more reliably prevented is provided. An imprinting method of forming the pattern of the imprint material on the substrate using the mold includes: a supply step of supplying the imprint material on the substrate; a pattern forming step of forming the pattern of the imprint material by bringing an imprint material in a predetermined shot region on the substrate into contact with a concave and convex pattern of the mold after supplying the imprint material; and a foreign particle pressing step of pressing the foreign particle using a pressing surface of a pressing unit facing a surface of the substrate if the foreign particle is present on the surface of the substrate in a predetermined shot region, wherein the foreign particle pressing step is performed before the pattern forming step, and in the foreign particle pressing step, the foreign particle is pressed so that an amount of protrusion is smaller than a film thickness of the imprint material after the pattern forming step.

12 Claims, 10 Drawing Sheets

IMPRINTING METHOD, IMPRINT APPARATUS, AND ARTICLE MANUFACTURING METHOD

BACKGROUND OF THE INVENTION

Field of the Invention

The present invention relates to an imprinting method used for an imprint apparatus or the like, an article manufacturing method, and the like.

Description of the Related Art

An example of an imprinting method using an imprint apparatus will be described below. In Japanese Patent No. 4660581, concave and convex patterns of first and second templates are formed on a base film formed on a substrate (a substrate to be processed) by transferring the patterns to an imprint material filled between the base film and a concave and convex pattern formed in a template (a mold). In this method, imprinting is performed selectively using the two templates in accordance with the presence or absence of foreign particle in a transfer region based on the result of foreign particle inspection performed on a surface of the substrate to be processed on which a process has been performed in advance. Thus, a concave and convex pattern of one of the first and second templates is protected from damage due to foreign particle.

According to this imprinting method, imprinting is performed on a shot region in which foreign particle is not present using the first template and imprinting is performed on a shot region in which foreign particle is present using the second template. Therefore, the concave and convex pattern of the first template is free from damage due to foreign particle and continuously contributes to high-quality imprinting.

However, in a conventional imprinting method, when a second template has a different material or shape from a first template, if imprinting is performed using the second template, there is a problem that the original pattern formed using the first template is not formed. Furthermore, if the second template has exactly the same properties as the first template, each time a concave and convex pattern of the second template is imprinted, there is also a problem that the number of damaged places increases due to an influence of foreign particle and the number of defective places of a pattern formed using the damaged concave and convex pattern increases.

SUMMARY OF THE INVENTION

An object of the present invention is to provide an imprinting method capable of performing original imprinting while more reliably preventing a concave and convex pattern of a mold from being damaged due to foreign particle.

An imprinting method as an aspect of the present invention is an imprinting method of forming a pattern of an imprint material on a substrate using a mold which includes: a supply step of supplying the imprint material on the substrate; a pattern forming step of forming the pattern by bringing a concave and convex pattern of the mold into contact with the imprint material of a predetermined shot region on the substrate after supplying the imprint material; and a foreign particle pressing step of pressing foreign particle using a pressing surface of a pressing unit facing a surface of the substrate when foreign particle is present on the surface of the substrate in the predetermined shot region, the foreign particle pressing step being performed before the pattern forming step, and in the foreign particle pressing step, the foreign particle being pressed so that an amount of protrusion is smaller than a film thickness of the imprint material after the pattern forming step.

Further features of the present invention will become apparent from the following description of exemplary embodiments with reference to the attached drawings.

DESCRIPTION OF THE EMBODIMENTS

Preferred embodiments of the present invention will be described in detail below with reference to the accompanying drawings and examples.

First Embodiment

Figure 1:
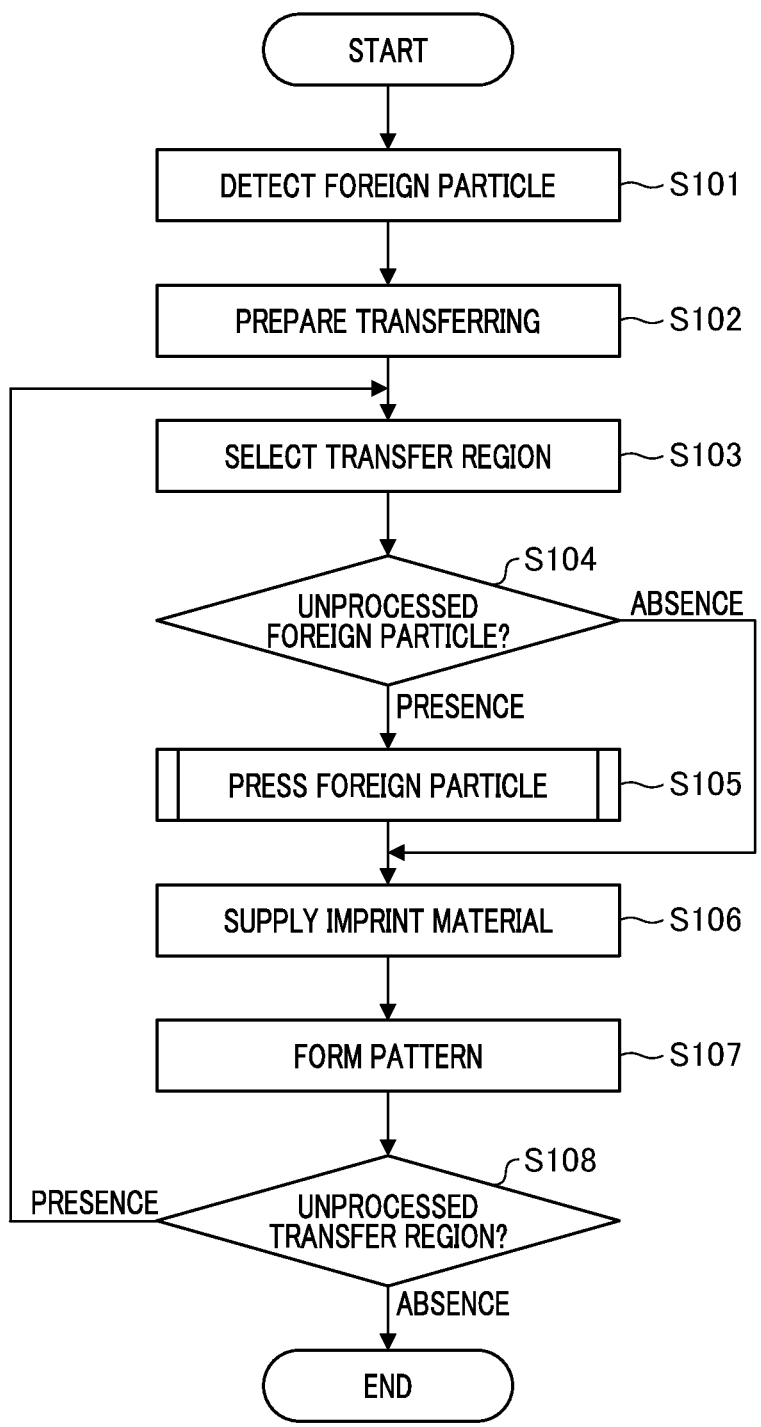
FIG. 1 is a flowchart for describing a process of an imprinting method in a first embodiment.

FIG. 1 is a flowchart for describing a process performed on one or more transfer regions (shot regions) of a substrate (a substrate to be processed or a wafer) 10 in an imprinting method of an imprint apparatus according to a first embodiment. The process illustrated in the flowchart of FIG. 1 is realized using a host computer 18 as illustrated in FIGS. 5A to 5E configured to generally control each unit as a control unit. Description will be provided below with reference to the reference numerals in FIGS. 5A to 5E, or the like.

In the imprinting method of the first embodiment, as illustrated in FIG. 1, first, in a foreign particle detection step (S101), a detection process of foreign particle 1 is performed over a range including the entire transfer region on a surface of a substrate 10. The foreign particle 1 is foreign particle present on the surface of the substrate 10. To be specific, a cured product of an imprint material (a resist) 15 produced in an imprint process before the detection process or foreign particle such as metal particles originating from another process or apparatus is assumed. Furthermore, regarding information concerning the detected foreign particle 1, of information concerning a position, a size, a height, a shape, and a material on the substrate 10 of the foreign particle 1, information concerning at least the position or the size is stored (recorded). The information is stored in a storage unit (a memory) 19 in the imprint apparatus or a host computer (or an internal computer) 18. The storage unit 19 functions as a storage means. Furthermore, information concerning the detected foreign particle 1 is stored and then the host computer 18 or the like is notified of the obtained information. As a means for the notification, for example, information on foreign particle may be displayed on an operation screen of a computer or an apparatus and a user may confirm the information through the screen. A foreign particle detection unit 16 is used for detecting the foreign particle 1. A unit used for the foreign particle detection unit 16 may be a foreign particle detecting light source 20 configured to detect the foreign particle 1 through the radiation of a light flux 22 of laser light, a high resolution camera, a sensor, or the like. The foreign particle detection unit 16 also functions as a foreign particle detection means.

Subsequently, in a transfer preparation step (S102), preparation for transfer including a positioning process of the substrate 10 is performed. Subsequently, in a transfer region selection step (S103), a transfer region (a predetermined shot region) with (on) which a concave and convex pattern of a pattern forming section of a mold 14 (a mould or a template) is brought into contact (imprinted) is selected from the storage unit 19 in the imprint apparatus or the host computer 18. Subsequently, in Step S104, if one or more pieces of foreign particle 1 are detected in the above-described transfer region on the basis of the information concerning the foreign particle 1 recorded in the foreign particle detection step (S101), it is determined that the one or more pieces of foreign particle 1 are "present" and the process proceeds to a foreign particle pressing step (S105). If no foreign particle 1 is detected or if the foreign particle 1 is smaller than a predetermined size and has a size in which the foreign particle 1 does not damage the mold 14 at the time of the imprint process, it is determined that the foreign particle 1 is "not present" and the process proceeds to an imprint material supplying step (S106).

Subsequently, in the foreign particle pressing step (S105), the foreign particle 1 detected in the above-described transfer region is pressed using a pressing unit 2 having a pressing surface facing the surface of the substrate 10 at a distal end thereof. Furthermore, after pressing the foreign particle 1, the process proceeds to the imprint material supplying step (S106). Subsequently, in the imprint material supplying step (S106), an imprint material 15 is supplied on the substrate 10 through a supply unit (a first nozzle 12) to cover the above-described transfer region, that is, the foreign particle pressed if the foreign particle 1 is present. After that, the process proceeds to a pattern forming step (S107). The supply unit configured to supply the imprint material 15 also functions as a supply means of the imprint material 15. In the pattern forming step (S107), with respect to the imprint material 15 supplied to the above-described transfer region, a pattern is formed by bringing the concave and convex pattern of the pattern forming section of the mold 14 into contact with the imprint material 15 on the substrate 10. The pattern forming section also functions as a pattern forming means.

Subsequently, in Step S108, a determination regarding whether a transfer region on which pattern formation has not been performed yet is "present" or "not present" is performed. In addition, if it is determined that a transfer region on which the pattern formation has not been performed yet is "not present," the process performed on the substrate 10 ends. If it is determined that a transfer region on which the pattern formation has not been performed yet is "present" as the result of the determination in Step S108, the process returns to the transfer region selection step (S103), the process moves to the next transfer region, and the same process is repeatedly performed.

As described above, the foreign particle pressing step (S105) of pressing the foreign particle 1 present on a surface of a predetermined transfer region of the substrate 10 detected in the foreign particle detection step (S101) using a pressing surface of the pressing unit 2 facing the surface of the substrate 10 before the pattern forming step (S107) is provided. Thus, when the imprinting method in the first embodiment is performed, it is possible to reduce a risk of damaging the mold 14 by pressing the detected foreign particle 1 present on the surface of the substrate 10.

Also, in the foreign particle detection step (S101), after a foreign particle detection process is performed on the range including the entire transfer region of the surface of the substrate 10, the process may proceed to the transfer preparation step (S102). Furthermore, after the preparation of the transfer is performed, the process proceeds to the transfer region selection step (S103). Subsequently, the transfer region is selected from the storage unit 19 in the imprint apparatus or the host computer 18. After that, Step S104 is omitted, and in the foreign particle pressing step (S105), pressing is performed on all foreign particle 1 detected in the foreign particle detection step (S101). After that, the process may proceed to the imprint material supplying step (S106) and the same process may be repeatedly performed. If the foreign particle 1 is not detected, the foreign particle pressing step (S105) is omitted. Thus, the step of performing a determination regarding whether the foreign particle 1 is "present" or "not present" can be omitted. Therefore, throughput can be improved because the number of steps can be reduced. Furthermore, since pressing is performed on the detected foreign particle 1 present on the surface of the substrate 10, it is possible to reduce a risk of damaging the mold 14.

Also, in the foreign particle detection step (S101), the foreign particle 1 may be detected for each shot region 6 illustrated in FIGS. 4A to 4D. In this case, after the transfer preparation step (S102) and the transfer region selection step (S103) are performed, the foreign particle detection step (S101) is performed. After preparation for the transfer is performed, a transfer region is selected. After that, a determination regarding whether the foreign particle 1 is "present" or "not present" for each one-shot region 6 in the transfer region is performed. If the foreign particle 1 is "present," the process proceeds to the foreign particle pressing step (S105). In addition, the detected foreign particle 1 is pressed and the process proceeds to the imprint material supplying step (S106). If the foreign particle 1 is "not present," the process proceeds to the imprint material supplying step (S106). Subsequently, in the pattern forming step (S107), a pattern is formed by bringing the concave and convex pattern of the pattern forming section of the mold 14 into contact with the imprint material 15 supplied to the transfer region in the imprint material supplying step (S106).

Also, in Step S108, a determination regarding whether a transfer region in which pattern formation has not been performed yet is "present" or "not present" is performed. In addition, if it is determined that a transfer region in which pattern formation has not been performed yet is "not present," the process performed on the substrate 10 ends. If a transfer region in which pattern formation has not been performed yet is "present" in the result of the determination in Step S108, the process returns to the transfer region selection step (S103), proceeds to the foreign particle detection step (S102), and the same process is repeatedly performed. Thus, since the foreign particle 1 is detected every time a transfer region is selected, for example, since it is possible to detect the foreign particle 1 which has adhered after the pattern formation and before the next transfer region selection, it is possible to reduce a risk of damaging the mold 14. After the imprint material supplying step (S106), the process may proceed to the foreign particle pressing step (S105). In this case, the foreign particle 1 covered with the imprint material 15 is pressed. Thus, it is possible accurately press the foreign particle 1 regardless of a shape or the like of the foreign particle 1.

Figure 2:
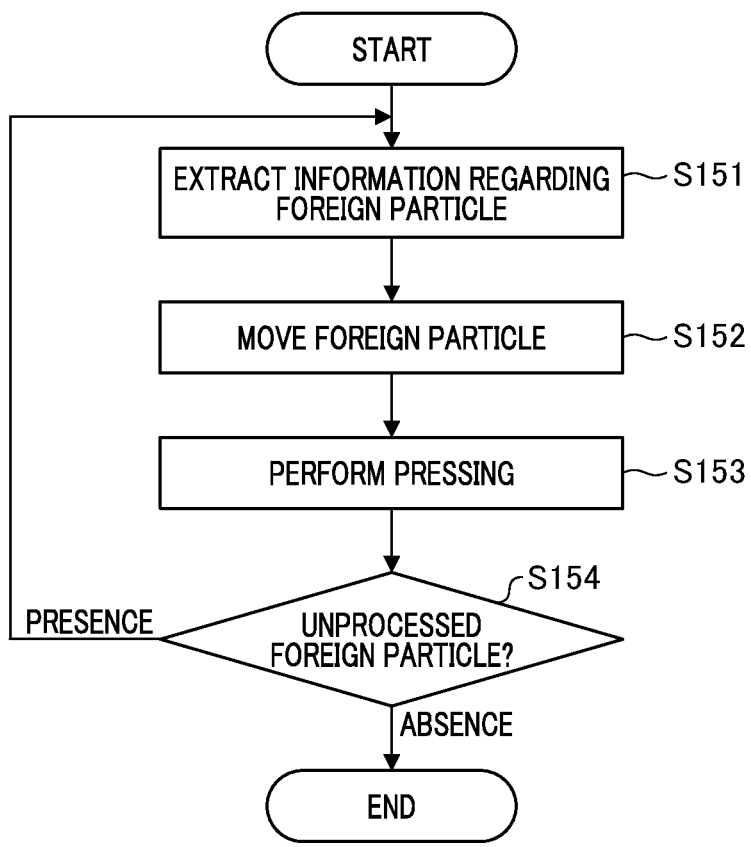
FIG. 2 is a flowchart for describing a process of a foreign particle pressing step in the first embodiment.
Figure 3A:
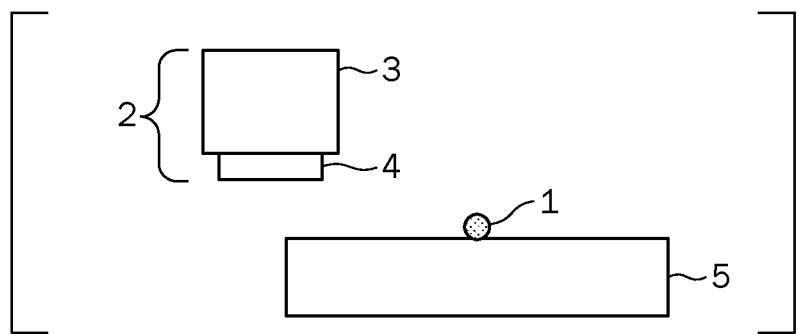
FIGS. 3A to 3D are diagrams illustrating the imprinting method in the first embodiment.
Figure 3B:
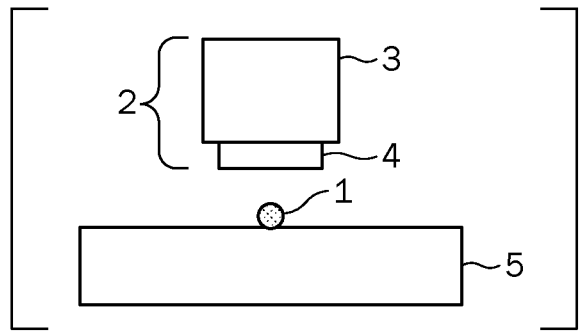
Figure 3C:
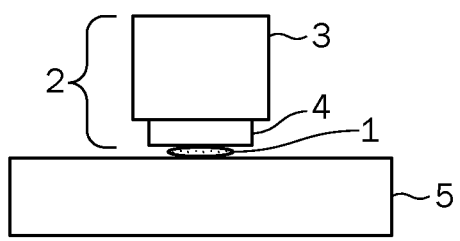
Figure 3D:
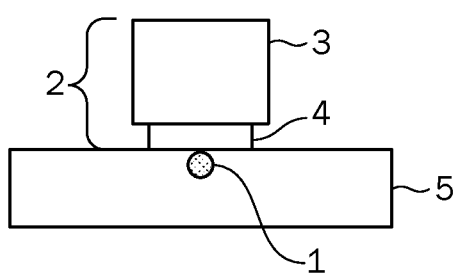

FIG. 2 is a flowchart for describing the processing details of the foreign particle pressing step (S105) expressed as a sub-process in the flowchart in FIG. 1. The processing details of the foreign particle pressing step (S105) in the first embodiment will be described below with reference to FIG. 2.

First, in a foreign particle information extracting step (S151), information concerning the foreign particle 1 recorded in the foreign particle detection step (S101) is extracted. The extraction of the information on the foreign particle includes extracting one piece of information concerning the foreign particle 1 which is detected in the transfer region with which the concave and convex pattern of the pattern forming section of the mold 14 is to come into contact and in which a record of "pressing completion" is not present. Subsequently, in a foreign particle moving step (S152), the foreign particle 1 is moved below the pressing unit 2 on the basis of the position on the substrate 10 included the extracted information concerning the foreign particle 1. That is to say, in order to make the foreign particle 1 and the pressing unit 2 face each other, a step of relatively moving the foreign particle 1 is performed. As a means for moving the foreign particle 1 below the pressing unit 2, the foreign particle 1 is relatively moved to a position in which pressing is possible below the pressing unit by driving the substrate 10 or a substrate stage 11 with respect to the foreign particle 1. Furthermore, a step of moving the pressing unit 2 to a position in which pressing is possible on the foreign particle 1 may be performed. That is to say, as a means for moving the pressing unit 2 to a position in which pressing is possible on the foreign particle 1, the pressing unit 2 is relatively moved to the position in which pressing is possible by driving the pressing unit 2 having a driving unit 3 with respect to the foreign particle 1. In the first embodiment, moving the pressing unit 2 on the foreign particle 1 is also included in the foreign particle moving step.

Subsequently, in a pressing step (S153), one piece of foreign particle 1 is pressed with respect to the substrate 10 using the pressing surface of the pressing unit 2 on the basis of the extracted foreign particle 1, and then a record of "pressing completion" regarding the foreign particle 1 is left in the storage unit 19 in the apparatus or the host computer 18. After that, a determination regarding whether the foreign particle 1 which has not been subjected to the pressing process yet (there is no record of "pressing completion") is "present" or "not present" in the transfer region in which the pattern is to be formed next is performed (S154). If it is determined that the result of the determination is "present," the process returns to Step S151. In addition, the process proceeds to the subsequent process for the foreign particle 1. If it is determined that the result of the determination is "not present," the foreign particle pressing step (S105) ends. Although it is desirable that pressing be performed in a direction perpendicular to the substrate 10 when pressing the foreign particle 1, if vertical pressing cannot be performed in accordance with a shape or the like of the foreign particle 1, the foreign particle 1 may be pressed while the pressing unit 2 is angled. If the foreign particle 1 is pressed, setting may be performed in advance so that the foreign particle 1 can be pressed not only once but also a plurality of times and the foreign particle 1 may be continuously pressed a plurality of times. If the foreign particle 1 is continuously pressed, the pressing step (S153) is performed again. In this case, after pressing the foreign particle 1, the foreign particle 1 may be pressed again in accordance with the pressed state of the foreign particle 1. Furthermore, during the period after the foreign particle pressing step (S105) and before the pattern forming step (S107) is performed, the foreign particle 1 which has been pressed once may be pressed again at a preferable timing.

In the imprint material supplying step (S106) in the first embodiment, for example, a method of supplying the imprint material 15 from the supply unit to supply the imprint material 15 for each of transfer regions is performed.

Also, constituent members associated with the imprint process such as an imprint head 13, the substrate stage 11, and the supply unit of the imprint apparatus using the imprinting method in the first embodiment are connected to the host computer 18 illustrated in FIGS. 5A to 5E through a wired or wireless communication line. Furthermore, the operations thereof are controlled. The host computer 18 has a built-in central processing unit (CPU) which reads a program from the storage unit 19 configured to store a computer program for controlling various operations and executes these computer programs. In this way, the host computer 18 functions as a control unit configured to control the operation of each unit of the imprint apparatus. The control unit may be provided inside the imprint apparatus or may be installed in a place different from the imprint apparatus and controlled remotely.

FIGS. 3A to 3D are diagrams illustrating an operation of the pressing unit 2 in the first embodiment. The pressing unit 2 includes the driving unit 3 and a distal end section 4 having a pressing surface which moves integrally with the driving unit 3 to press the foreign particle 1. The driving unit 3 has a mechanism of allowing the pressing unit 2 to move in a horizontal direction thereof and to move upward and downward in a vertical direction and allows relative movement so that the pressing surface of the distal end section 4 faces the foreign particle 1. Furthermore, the number of pressing unit 2 is not limited to one in the imprint apparatus and a plurality of pressing unit 2 may be provided in the imprint apparatus. The vicinity of the foreign particle 5 indicates the vicinity of the foreign particle 1 present on the surface of the substrate 10. As described above, the distal end section 4 has the pressing surface configured to press the foreign particle 1 present on the surface of the substrate 10. The pressing surface may be a flat surface or a concave and convex surface and may have a circular shape or a needle-like shape. In addition, a process of providing a lattice-shaped slit or a plurality of grooves may be performed on these constitutions. Thus, it is possible to reliably catch and press foreign particle.

According to the first embodiment, when the foreign particle pressing step (S105) is completed, the foreign particle 1 is crushed on the surface of the substrate 10. Alternatively, a height of the foreign particle 1 from the surface of the substrate 10 before the foreign particle pressing step (S105) is reduced by burying in the base film of the substrate 10 or partially crushing and partially burying. As such a base film, an adhesion layer of such as $SiO_2$ or $SiN$, a flattened layer formed of an SOG material, or an imprint material is conceivable and it is conceivable that the foreign particle 1 be pressed against such an underlayer. When the foreign particle pressing step (S105) is performed, the mold 14 can be prevented from being damaged at the time of pattern formation by burying or crushing the foreign particle 1 in such an underlayer so that flattening is performed as much as possible. It is desirable that an extent of burial and an extent of flattening be an extent that the mold 14 is not damaged and a size may be smaller than a residual layer thickness (RLT) of the imprint material 15 after the pattern forming step (S107). That is to say, in the foreign particle pressing step (S105), the foreign particle 1 may be pressed to such an extent that it does not protrude from the surface of the imprint material 15 remaining after the pattern forming step (S107). If an amount of protrusion from a plane section of the base film is about 10 nm, the mold 14 is not damaged. Thus, it can be said that there is an effect. A hardness on the pressing surface of the pressing unit 2 being sufficiently higher than a hardness of the foreign particle 1 is a condition for stably leading the foreign particle 1 to any one of the above three states. Thus, if a component or a composition of the foreign particle 1 present on the substrate 10 is known in advance, a material having a hardness higher than that of a material with the highest hardness estimated from them may be used for the distal end section 4 of the pressing unit 2. For example, if the foreign particle 1 with the highest hardness is quartz with a hardness of 1103 Hv, a vapor of a ceramic with a hardness of 2350 Hv may be deposited on the distal end section 4 of the pressing unit 2. If all substances present in the surrounding environment are likely to adhere to the surface of the substrate 10 as the foreign particle 1 and a maximum hardness cannot be identified, constituting the distal end section 4 using diamond as a material of the distal end section 4 of the pressing unit 2 is effective for obtaining stable pressing results. Furthermore, synthetic diamond is effective in consideration of cost effectiveness.

Figure 4A:
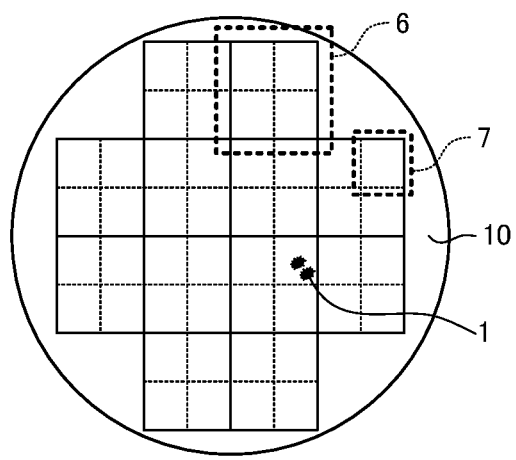
FIGS. 4A to 4D are diagrams illustrating an example of a substrate in the first embodiment.
Figure 4C:
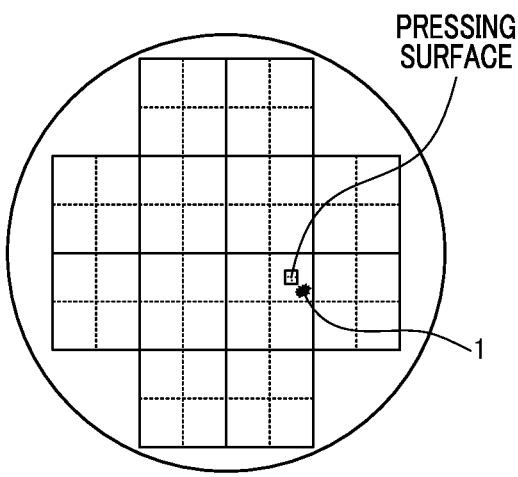
Figure 4B:
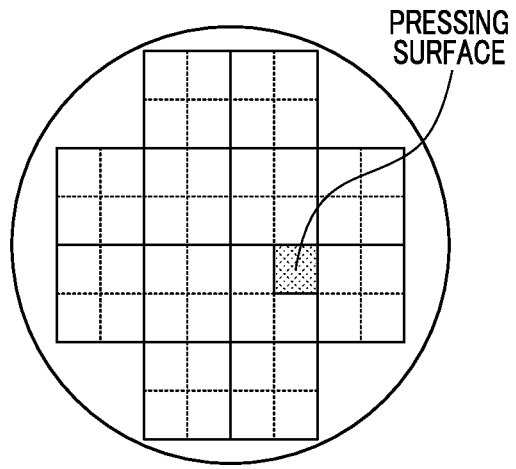
Figure 4D:
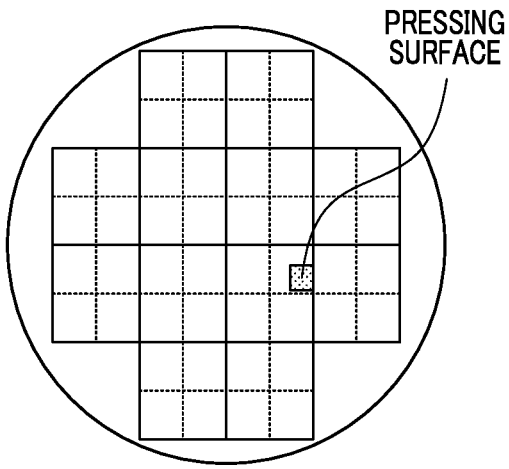

FIGS. 4A to 4D are diagrams illustrating an example of the substrate 10 in the first embodiment. The shot region 6 is one shot region in the imprint process. A chip region 7 is one chip region present in one shot region 6. In pattern formation in a normal imprint process, imprinting is performed on a plurality of chip regions through one shot. For this reason, a plurality of chip regions are included in one shot region 6. In the first embodiment, it is assumed that four (2x2) chip regions are arranged in one shot region 6 of the substrate 10. FIG. 4A is a diagram illustrating a plurality of pieces of foreign particle 1 present in one chip region 7 in one shot region 6 of the substrate 10. FIG. 4B is a diagram illustrating a state in which a pressing surface which is larger than the foreign particle 1 and has a size of one chip region or more presses the foreign particle 1 with respect to the substrate 10. FIG. 4C is a diagram illustrating a state in which a pressing surface larger than one piece of foreign particle 1 and smaller than one chip region 7 presses one piece of foreign particle 1 present on a surface of one chip region 7 with respect to the substrate 10. FIG. 4D is a diagram illustrating a state in which a pressing surface which is larger than two or more pieces of foreign particle 1 and smaller than one chip region 7 presses a piece of foreign particle 1 with respect to the substrate 10.

Foreign particle 1 present on the surface of the substrate 10 has various sizes and also has different heights, shapes, and the like. Here, when the foreign particle pressing step (S105) in the first embodiment is performed, as illustrated in FIGS. 4B, 4C, and 4D, it is conceivable that the pressing surface have various sizes. For example, it is desirable that a pressing surface have at least a size equal to one chip region or a size equal to or less than one chip region with respect to the substrate 10. In this way, when the foreign particle 1 present on the surface of the substrate 10 is pressed by making the pressing surface selectable, it is possible to realize pressing of the foreign particle 1 regardless of a size or the like of the foreign particle 1. At the same time, it is possible to reduce a risk of damaging the mold 14.

Second Embodiment

Figure 5A:
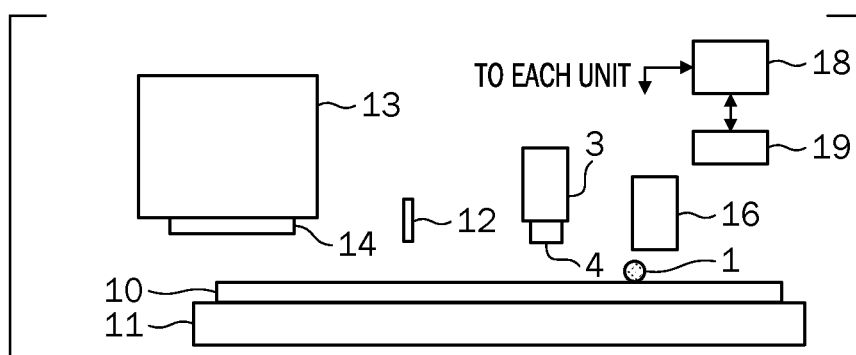
FIGS. 5A to 5E are diagrams illustrating an imprinting method in a second embodiment.
Figure 5B:
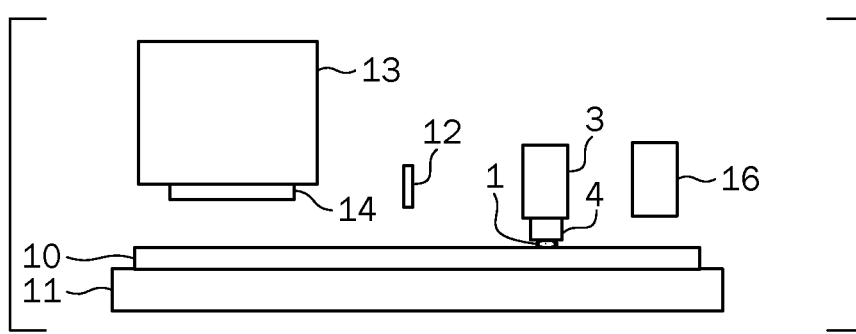
Figure 5C:
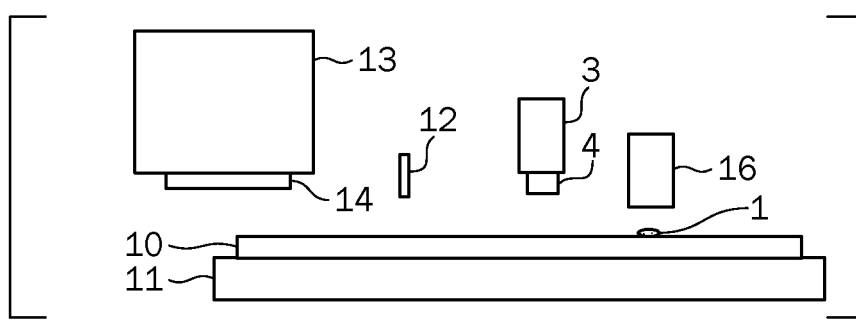
Figure 5D:
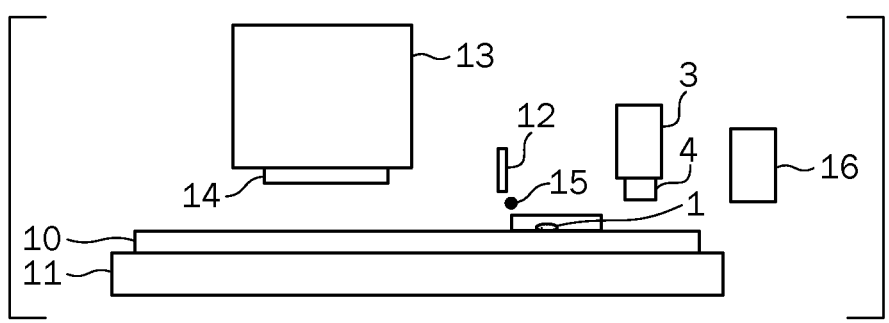
Figure 5E:
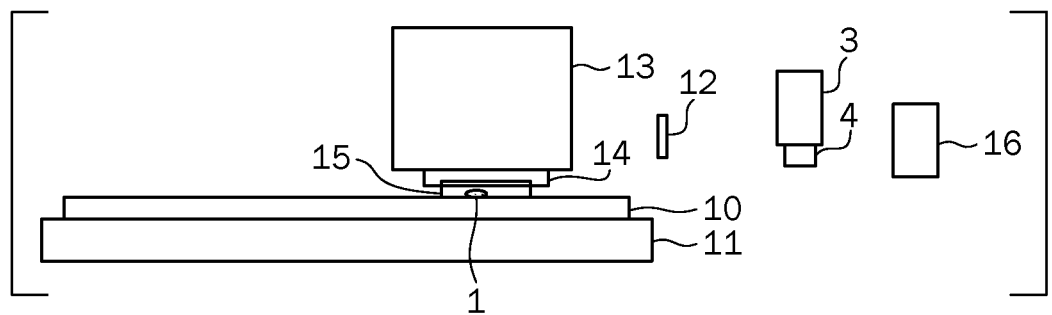

FIGS. 5A to 5E are diagrams illustrating a constitution of an imprint apparatus illustrated with limited constituent objects to effectively explain an imprinting method in a second embodiment and a flow of steps of an imprint process using the apparatus. A substrate stage 11 is a stage configured to move a substrate 10 in a horizontal direction while holding the substrate 10. A first nozzle 12 is a nozzle configured to discharge an imprint material 15 and also functions as a supply unit configured to supply the imprint material 15 on the substrate 10. The imprint head 13 controls an attitude of a mold 14 while holding the mold 14 and performs upward and downward driving in which a concave and convex pattern of the mold 14 is brought into contact with the imprint material 15. Furthermore, there is a mechanism of curing the imprint material 15 while the concave and convex pattern of the mold 14 is in contact with the imprint material 15 using ultraviolet rays or the like from a built-in light source. The mold 14 is a mold held using the imprint head 13. The imprint material 15 is discharged through the first nozzle 12 while the stage is moving and has ultraviolet curability (photocurability). Although a foreign particle detection unit 16 is a mechanism used for detecting a foreign particle 1, the foreign particle detection unit 16 can also be used as a mechanism of observing a state of the pressed foreign particle 1. That is to say, the foreign particle detection unit 16 also functions as a foreign matter detection means and a foreign particle observation means. Furthermore, FIG. 5A illustrates a state before the pressing step (S152) and FIG. 5B illustrates a state in which the foreign particle 1 is pressed. FIG. 5C illustrates a state in which the pressed foreign particle 1 is observed using the foreign particle detection unit 16. FIG. 5D illustrates a state in which the imprint material 15 is distributed in the transfer region in which the pressed foreign particle 1 is present on the surface of the substrate 10 while the imprint material 15 is discharged through the first nozzle 12. FIG. 5E illustrates a state in which the concave and convex pattern of the mold 14 is transferred to the imprint material 15 distributed in the transfer region.

According to the second embodiment, it is possible to reduce a risk of damaging the mold 14 by pressing the foreign particle 1 present in the transfer region using the pressing surface of the pressing unit 2. For example, in a case in which a semiconductor memory is produced, due to an influence of the foreign particle 1 in the transfer region, the finally produced semiconductor memory may have a defect in a circuit near the foreign particle 5 in some cases. Furthermore, if a transfer region for one shot has a plurality of chips, a plurality of chips having a portion in which the foreign particle 1 is present are likely to be defective. However, although the chip region 7 in which the foreign particle 1 is present is likely to be defective when performing the imprinting method in the second embodiment, the remaining chip region 7 is not affected by the foreign particle 1. Furthermore, after the foreign particle pressing step (S105), the result of the pressing step (S153) can be evaluated by performing an observation step of observing the vicinity in which the foreign particle 1 is present on the surface of the substrate 10. Based on the result of this observation step, an adjustment unit and a step of adjusting at least one of an amount or distribution of the imprint material 15 in the next imprint material supplying step (S106) of supplying the imprint material 15 may be provided.

Also, a numerical value set in advance for the substrate 10 and the foreign particle 1 is extracted from the storage unit 19 or the host computer 18. After that, as the result of observing the substrate 10 after the foreign particle 1 is pressed, if the numerical value is larger than a set value, the foreign particle 1 may be pressed again assuming that the result of the pressing step is not sufficiently obtained. That is to say, if a state of the foreign particle 1 after the foreign particle 1 is pressed is observed and the foreign particle 1 protrudes to such an extent that the mold 14 would be damaged, the foreign particle 1 is pressed again in the foreign particle pressing step (S105) without performing the imprint process using the mold 14. If the mold 14 would not be damaged, the imprint process is performed. In other words, the host computer 18 determines whether to perform the pattern forming step (S107) of transferring a concave and convex pattern in accordance with the detection result again. As a result of the determination, if the mold 14 would be damaged due to breakage or the like, control is performed so that the pattern forming step (S107) is not performed.

Third Embodiment

Figure 6A:
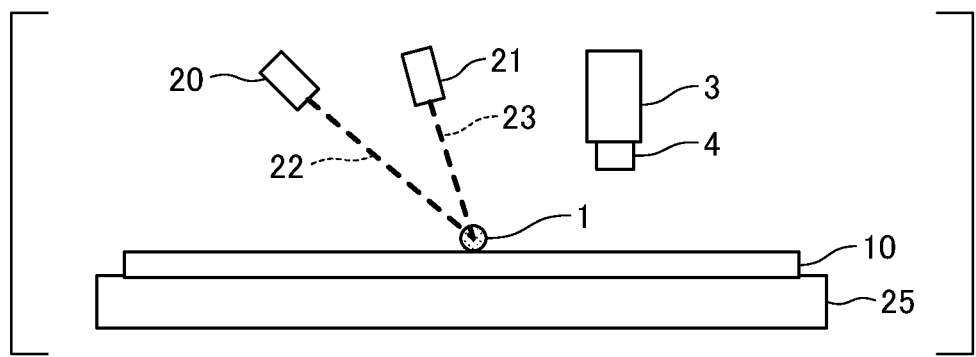
FIGS. 6A and 6B are diagrams illustrating an imprinting method in a third embodiment.
Figure 6B:
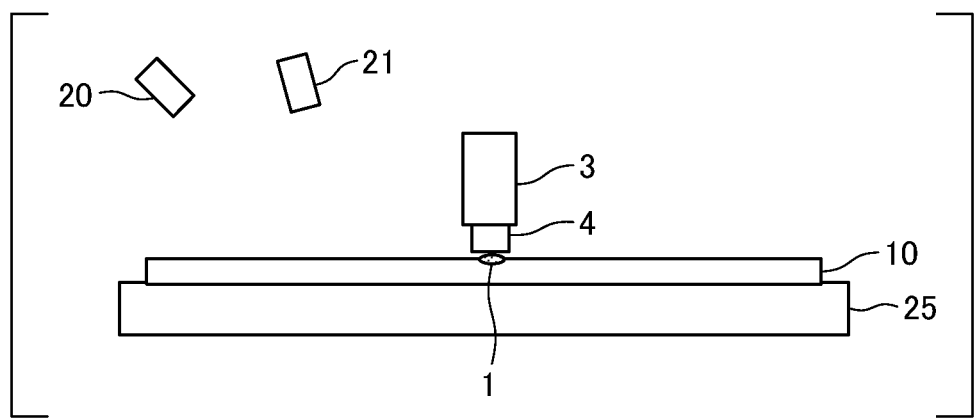

FIGS. 6A and 6B are diagrams illustrating a pressing unit 2 formed in a foreign particle detection apparatus outside an imprint apparatus for an imprinting method in a third embodiment. A foreign particle detection light source 20 irradiates a surface of a substrate 10 with a light flux 22 of laser light to detect a foreign particle 1 present on the surface of the substrate 10 and detects the foreign particle 1. A foreign particle detection sensor 21 is a sensor configured to detect a part 23 of scattered light of the light flux 22 hitting and scattered by the foreign particle 1 present on the surface of the substrate 10. A foreign particle detection stage 25 is a stage which includes a drive mechanism (not shown) and using which the substrate 10 is moved to irradiate a wide range of the surface of the held substrate 10 with the light flux 22.

FIG. 6A illustrates a state in which the foreign particle 1 is detected. FIG. 6B illustrates a state in which pressing is performed on the foreign particle 1 as in FIG. 5B. When detecting the foreign particle, the foreign particle 1 may be detected using a foreign particle detection unit 16 other than the foreign particle detection light source 20. Furthermore, the foreign particle 1 can be relatively moved below the pressing unit 2 by driving the foreign particle detection stage 25 with respect to the pressing unit 2. The pressing unit 2 may be relatively moved on the foreign particle 1 with respect to the foreign particle 1 by driving the pressing unit 2 including the driving unit 3. In addition, both of the pressing unit 2 and the foreign particle detection stage 25 may be driven. Furthermore, only the detection of the foreign particle 1 is performed in the foreign particle detection apparatus, information concerning a detected position, size, and the like of the foreign particle 1 being recorded in a storage unit 19 in a foreign particle inspection apparatus, the storage unit 19 in the imprint apparatus, or the host computer 18. After that, the substrate 10 in which the foreign particle has been detected may be loaded into the imprint apparatus, information concerning the foreign particle 1 detected in advance may be read, and a pressing process of the foreign particle 1 may be performed.

According to the third embodiment, since a structure in which the foreign particle detection unit 16 or the foreign particle detection unit 16 and the pressing unit 2 are not provided can be provided in the imprint apparatus, it is possible to reduce a size of the apparatus. Furthermore, since the foreign particle detection step (S101) of the imprinting process can be omitted, the throughput can be improved. In addition, since the detected foreign particle 1 present on the surface of the substrate 10 is also pressed, it is possible to reduce a risk of damaging the mold 14.

Fourth Embodiment

FIGS. 7A to 7E are diagrams illustrating a pressing method in an imprinting method in a fourth embodiment. A coating material 32 is a material configured to prevent scattering of the foreign particle 1 which may occur due to pressing and alleviate impacting of the foreign particle 1. A second nozzle 33 is a nozzle through which the coating material 32 is supplied on the foreign particle 1 and around the foreign particle 1. In the fourth embodiment, a coating material supply step of supplying the coating material 32 on the foreign particle 1 and around the foreign particle 1 through the second nozzle 33 is performed. Furthermore, the coating material 32 has photocurability. In addition, after the coating material supply step, a coating material curing step of curing the coating material 32 by irradiating the coating material 32 with light is performed. Here, the coating material 32 may have a viscosity with an extent that the coating material 32 does not scatter at the time of application or pressing. In addition, the coating material 32 may be adopted as long as it has affinity with the imprint material 15.

Figure 7A:
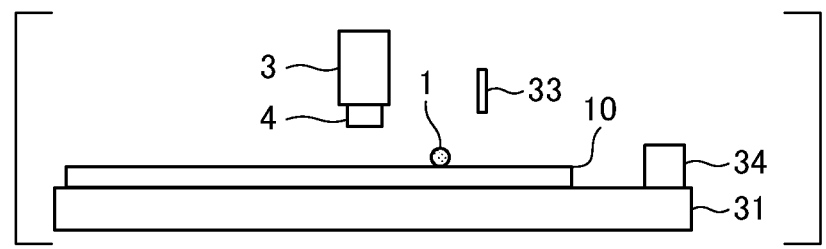
FIGS. 7A to 7E are diagrams illustrating an imprinting method in a fourth embodiment.
Figure 7B:
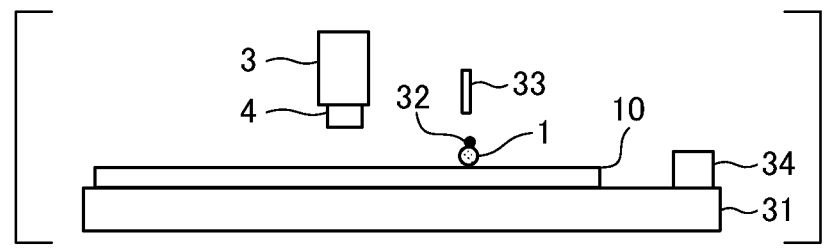
Figure 7C:
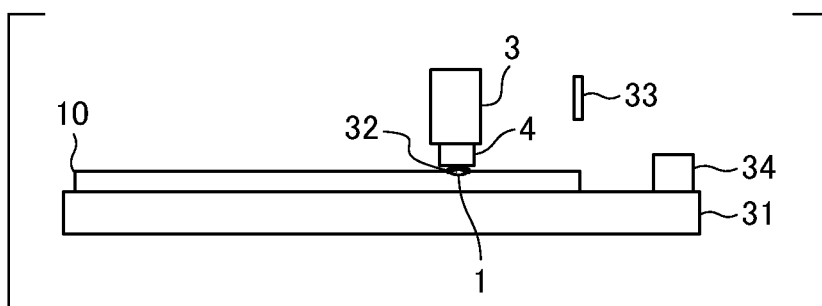
Figure 7D:
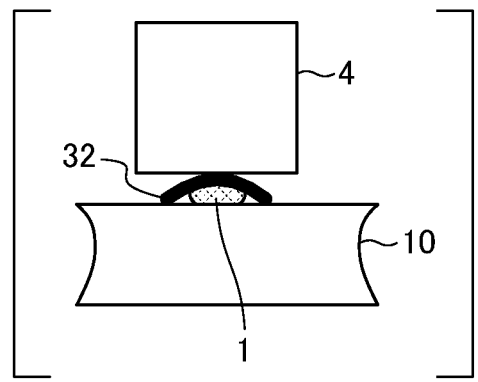
Figure 7E:
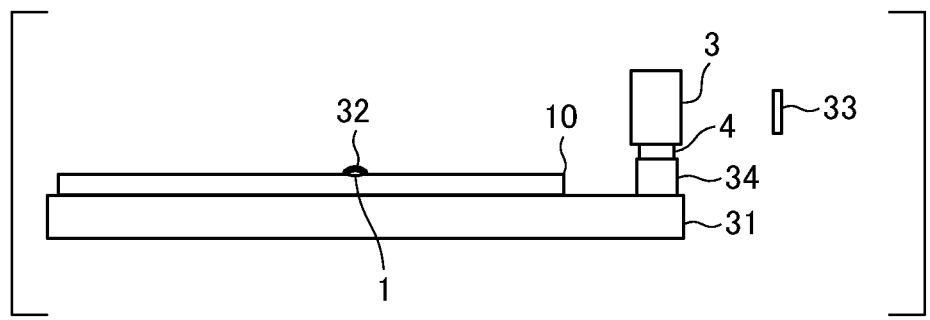

Here, FIG. 7A illustrates a state before the pressing step (S153). FIG. 7B illustrates a state in which the coating material 32 is discharged through the second nozzle 33 before the pressing step (S153) and is supplied to the foreign particle 1 and around the foreign particle 1. FIG. 7C illustrates a state in which, in the pressing step (S153), the foreign particle 1 is pressed using the distal end section 4 of the pressing unit 2 via the coating material 32. FIG. 7D illustrates a state in which the vicinity of the foreign particle 1 in FIG. 7C is enlarged. FIG. 7E illustrates a state in which a pressing surface of the pressing unit 2 onto which the coating material 32 and/or the foreign particle 1 are attached and the periphery thereof is cleaned using a cleaning unit 34. In the fourth embodiment, the cleaning unit 34 can perform a cleaning process of cleaning the pressing surface and the periphery thereof. Here, the cleaning is not limited to cleaning using water or bubbles, and may be plasma cleaning, cleaning using a chemical agent, cleaning using ultrasonic waves, or the like.

According to the fourth embodiment, it is possible to prevent scattering of the foreign particle 1 in the pressing step (S153) by covering the periphery of the foreign particle 1 with the coating material 32. Furthermore, it is possible to prevent secondary contamination by cleaning the pressing surface of the pressing unit 2 onto which the coating material 32 or the foreign particle 1 is attached and the periphery thereof.

Also, the same effect can be obtained by substituting the imprint material 15 discharged through the first nozzle 12 instead of the coating material 32 discharged through the second nozzle 33. The imprint material 15 may be discharged through the second nozzle 33 other than the first nozzle 12 and the coating material 32 may be discharged through the first nozzle 12. If an ultraviolet curable resin is used as the coating material 32, the distal end section 4 of the pressing unit 2 made of a material through which ultraviolet rays are transmitted and a light source newly provided in the apparatus and configured to radiate ultraviolet rays so that the coating material 32 covering the foreign particle 1 can be cured via the distal end section 4 of the pressing unit 2 being pressed are used. As a material for the distal end section 4 of the pressing unit 2 as described above, for example, synthetic diamond which is hard and through which ultraviolet rays are transmitted is effective.

Fifth Embodiment

Figure 8:
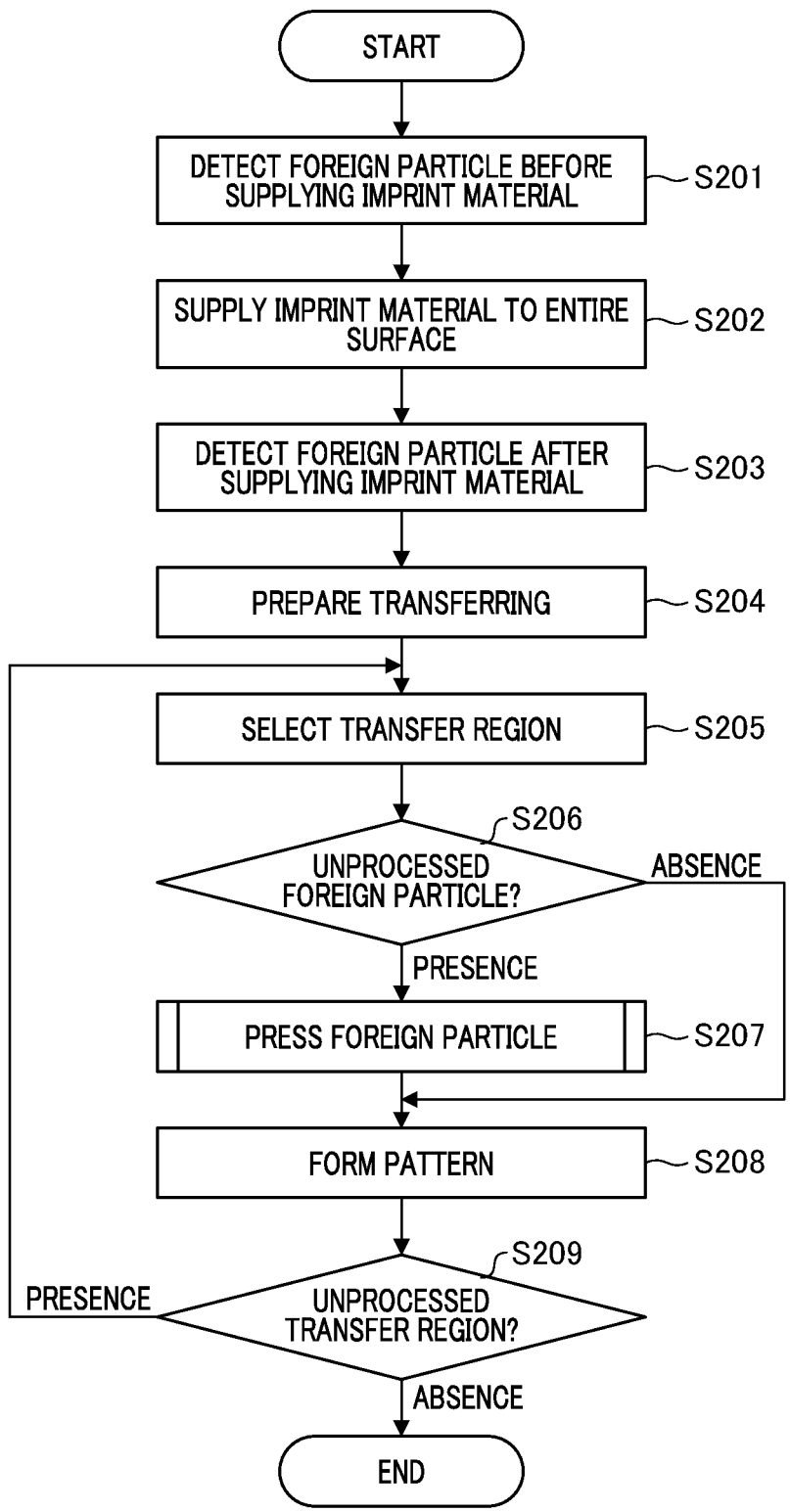
FIG. 8 is a flowchart for describing a process of an imprinting method in a fifth embodiment.

FIG. 8 is a flowchart for describing a process of a substrate 10 in an imprinting method in a fifth embodiment. In the imprinting method in the fifth embodiment, as illustrated in FIG. 8, first, in a foreign particle detection step (S201) before an imprint material 15 is supplied, a foreign particle detection process is performed in the range including the entire transfer region of a surface of a substrate 10. Furthermore, as information concerning detected foreign particle 1, of a position, a size, a height, a shape, a material, and the like on the substrate 10 of the foreign particle 1, information concerning at least the position or the size is recorded in a storage unit 19 in an imprint apparatus or a host computer 18. In addition, after information concerning the detected foreign particle 1 is acquired, the acquired information concerning the foreign particle 1 is recorded or the host computer 18 is notified of the acquired information concerning the foreign particle 1. Subsequently, the process proceeds to an entire surface supply step (S202) of the imprint material 15 and the imprint material 15 is supplied to the surface of the substrate 10 through a supply unit in the range including the entire transfer region thereof. Subsequently, after the imprint material 15 is supplied, in a foreign particle detection step (S203), the foreign particle detection process performed in Step S201 is performed in the range including the entire transfer region of the surface of the substrate 10 to which the imprint material 15 is supplied.

Subsequently, in a transfer preparation step (S204), preparation of transfer including positioning of the substrate 10 is performed. Subsequently, in a transfer region selection step (S205), a transfer region which is brought into contact with a concave and convex pattern of a pattern forming section of a mold 14 next is selected from the storage unit 19 in the imprint apparatus or the host computer 18. Subsequently, in Step S206, based on information concerning the foreign particle 1 recorded in Step S201 and Step S203, if one or more foreign particle 1 is detected in the above-described transfer region, it is determined that the foreign particle 1 is "present" and the process proceeds to a foreign particle pressing step (S207). If no foreign particle 1 is detected or if the foreign particle 1 has a size smaller than a predetermined size, it is determined that the foreign particle 1 is "not present" and the process proceeds to the pattern forming step (S208). In the foreign particle pressing step (S207), the foreign particle 1 detected in the above-described transfer region is pressed using the pressing unit 2 having the pressing surface facing the surface of the substrate 10 provided at a distal end thereof.

Also, after the foreign particle 1 is pressed, the process proceeds to the pattern forming step (S208). In the pattern forming step (S208), with respect to the imprint material 15 supplied to the above-described transfer region, a pattern is formed by bringing the concave and convex pattern of the pattern forming section of the mold 14 into the imprint material 15. Subsequently, in Step S209, a determination concerning whether a transfer region in which pattern formation has not been performed yet is "present" or "not present" is performed. In addition, if it is determined that the transfer region in which pattern formation has not been performed yet is "not present," the process performed on the substrate 10 is completed. If it is determined that the transfer region in which pattern formation has not been performed yet is "present" as a result of the determination of Step S209, the process returns to the transfer region selection step (S205), the movement to the next transfer region is performed, and the same process is repeatedly performed. The detection probability of the foreign particle 1 is improved by performing the imprinting method in the fifth embodiment and it is possible to reduce a risk of damaging the mold 14 by pressing the detected foreign particle 1.

Figure 9:
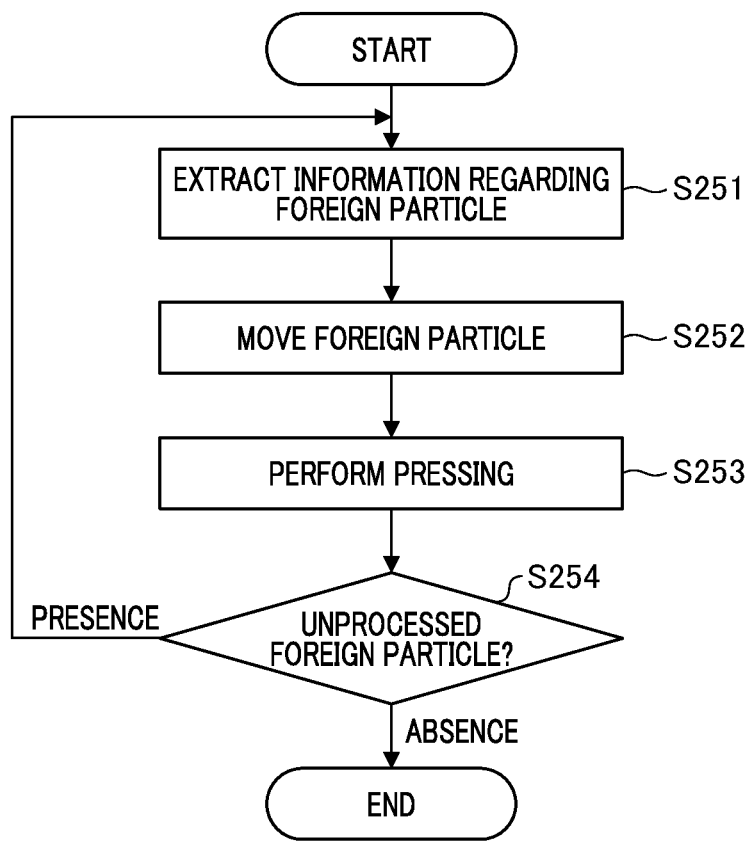
FIG. 9 is a flowchart for describing a process of a foreign particle pressing step in the fifth embodiment.

FIG. 9 is a flowchart for describing the foreign particle pressing step (S207) expressed as a sub-process in the flowchart in FIG. 8. The processing details of the foreign particle pressing step (S207) in the fifth embodiment will be described below with reference to FIG. 9.

First, in the foreign particle information extracting step (S251), information regarding the foreign particle 1 recorded in the foreign particle detection step (S203) is extracted. The extraction of the information regarding foreign particle is to extract one piece of information regarding a foreign particle 1 in which a transfer region with which the concave and convex pattern of the pattern forming section of the mold 14 is to come into contact next is detected and there is no record of "pressing completion." Subsequently, in the foreign particle moving step (S252), a step of moving the foreign particle 1 below the pressing unit 2 is performed on the basis of a position on the substrate 10 included in the extracted information regarding the foreign particle 1. As a means for moving the foreign particle 1 below the pressing unit 2, the foreign particle 1 is relatively moved to the position in which pressing is possible below the pressing unit by moving the substrate 10 or the substrate stage 11 with respect to the pressing unit 2. Furthermore, a step of moving the pressing unit 2 to a position in which pressing is possible on the foreign particle 1 may be performed. In this case, as a means for moving the pressing unit 2 to a position in which pressing is possible on the foreign particle 1, the pressing unit 2 is relatively moved to the position in which pressing is possible by driving the pressing unit 2 having the driving unit 3 with respect to the foreign particle 1. Subsequently, in the pressing step (S253), one foreign particle 1 is pressed against the substrate 10 using the pressing surface of the pressing unit 2 on the basis of the extracted information regarding the foreign particle 1. Also in the fifth embodiment, the foreign particle 1 is in a crushed state as in the first embodiment. Alternatively, it is possible to reduce a height of the foreign particle 1 from a surface before the pressing step (S253) by being buried in the base film of the substrate 10 or partially crushed. It is possible to prevent the mold 14 from being damaged at the time of pattern formation by burying the foreign particle 1 in such a base film or crushing the foreign particle 1 and flattening it as much as possible by performing the pressing step (S253). As a degree of burying and a degree of flattening, it is desirable to perform the process to such an extent that the mold 14 is not damaged and a size may be smaller than the residual layer thickness (RLT) of the imprint material 15 after the pattern forming step (S208). After the foreign particle 1 is pressed in the pressing step (S253), with respect to the foreign particle 1, the notification and the record of "pressing completion" are performed in the storage unit 19 in the apparatus or the host computer 18. After that, in Step S254, a determination concerning whether a foreign particle 1 which has not been subjected to a pressing process yet (there is no record of "pressing completion") is "present" or "not present" in a transfer region on which a pattern is formed next is performed. If it is determined that the foreign particle 1 which has not been subjected to a pressing process yet is "present," the process returns to Step S251 and the process for the next foreign particle 1 is performed. In addition, if it is determined that the foreign particle 1 which has not been subjected to a pressing process yet is "not present," the foreign particle pressing step (S207) is completed.

Also, the foreign particle detection step (S201) before the supplying of the imprint material 15 may be omitted in accordance with the processing conditions in the entire surface supply step (S202) of the imprint material 15 and the pattern forming step (S208) in the fifth embodiment. After the imprint material 15 is supplied, even when the foreign particle pressing step (S207) is performed on the basis of the information regarding the foreign particle 1 recorded in the foreign particle detection step (S203), damage to the mold 14 due to the foreign particle 1 may be minimized in some cases. Thus, it is possible to shorten the process and improve the throughput. Furthermore, there is also an effect of reducing damage to the mold 14 due to the detected foreign particle 1 present on the surface of the substrate 10.

Furthermore, in the entire surface supply step (S202) of the imprint material 15 in the fifth embodiment, for example, the imprint material 15 may be applied using a spin coating to supply the imprint material 15 to the entire surface of the substrate 10. A step of supplying the imprint material 15 may be performed inside the imprint apparatus or may be performed outside the imprint apparatus.

(Embodiment of Article Manufacturing Method)

An article manufacturing method according to this embodiment is suitable for manufacturing a microdevice such as a semiconductor device or an article such as an element having a fine structure. The article manufacturing method in this embodiment includes a step of forming a pattern on an imprint material applied on a substrate using the imprint apparatus (a step of performing an imprint process on a substrate) and a step of processing the substrate on which a pattern is formed in such a step. Furthermore, such a manufacturing method includes other well-known processes (oxidation, film formation, vapor deposition, doping, planarization, etching, composition peeling, dicing, bonding, packaging, and the like). The article manufacturing method in this embodiment is advantageous in at least one of the performance, the quality, the productivity, and the production cost of the article as compared with the conventional method.

The pattern of the cured product formed using the imprint apparatus is used for at least a part of various articles permanently or temporarily when the various articles are manufactured. The article is an electric circuit element, an optical element, an MEMS, a recording element, a sensor, a mold, or the like. Examples of the electric circuit element include volatile or non-volatile semiconductor memory such as DRAM, SRAM, a flash memory, and an MRAM, a semiconductor element such as an LSI, a CCD, an image sensor, and an FPGA, and the like. Examples of the mold include an imprint mold and the like.

The pattern of the cured product is used as it is as a constituent member of at least a part of the article or is temporarily used as a composition mask. After etching or ion implantation is performed in the substrate process step, the composition mask is removed.

Figure 10A:
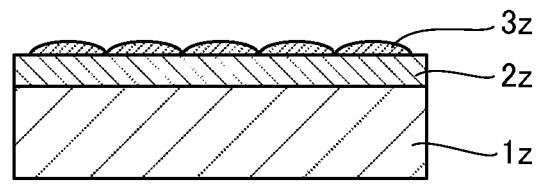
FIGS. 10A to 10F are diagram illustrating an example of an article manufacturing method.

A specific article manufacturing method will be described below. As illustrated in FIG. 10A, a substrate 1z such as a silicon substrate whose surface has a member 2z to be processed such as an insulator formed thereon is prepared. Subsequently, an imprint material 3z is applied to the surface of the member 2z to be processed using an inkjet method or the like. Here, a state in which the imprint material 3z in the form of a plurality of droplets is applied on the substrate is illustrated.

Figure 10B:
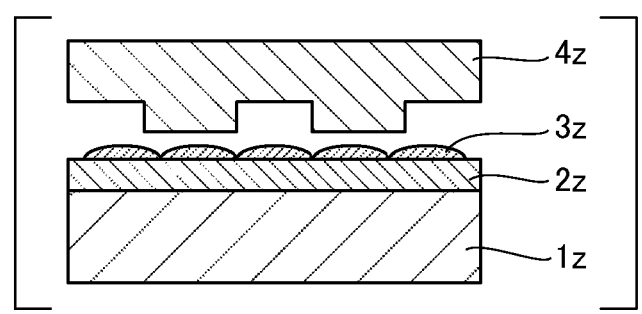
Figure 10C:
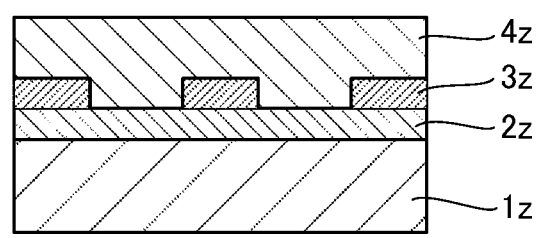

As illustrated in FIG. 10B, a side of an imprint mold 4z on which a concave and convex pattern thereof is formed is directed toward the imprint material 3z on the substrate to face the imprint material 3z. As illustrated in FIG. 10C, the substrate 1z having the imprint material 3z applied thereto is brought into contact with a mold 4z and pressure is applied to them. A gap between the mold 4z and the member 2z to be processed is filled with the imprint material 3z. In this state, if the irradiation of light as energy for curing is performed through the mold 4z, the imprint material 3z is cured.

Figure 10D:
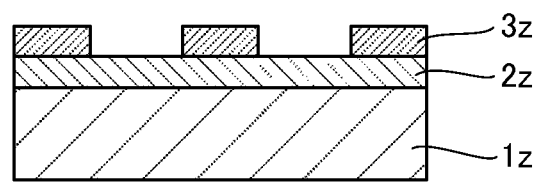

As illustrated in FIG. 10D, after the imprint material 3z is cured, if the mold 4z and the substrate 1z are separated, a pattern of a cured product of the imprint material 3z is formed on the substrate 1z. The pattern of the cured product has a shape in which a concave portion of the mold corresponds to a convex portion of the cured product and the convex portion of the mold corresponds to the concave portion of the cured product, that is, the concave and convex pattern of the mold 4z is transferred to the imprint material 3z.

Figure 10E:
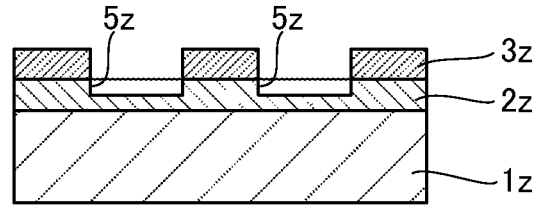
Figure 10F:
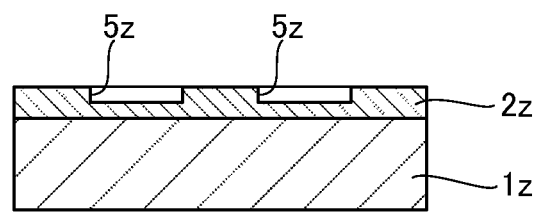

As illustrated in FIG. 10E, if etching is performed using the pattern of the cured product as an etching-resistant mask, a portion of a surface of the member 2z to be processed in which there is no cured product or the thin cure product remains is removed and a groove 5z is formed. As illustrated in FIG. 10F, if the pattern of the cured product is removed, it is possible to obtain the article in which the groove 5z is formed in the surface of the member 2z to be processed. Here, although the pattern of the cured product is removed, for example, the pattern of the cured product may be used as an interlayer insulating film included in a semiconductor element or the like, that is, a constituent member of the article without being removed even after the processing. Although an example in which the mold for transferring the circuit pattern having the concave and convex pattern is used as the mold 4z has been described, the mold may be a flat template having a plane section which does not have a concave and convex pattern.

Also, a computer program for realizing, as a function of the above-described embodiment, a part or all of control in the above-described embodiment may be supplied to the imprint apparatus or the like via a network or various storage media. Furthermore, a computer (or a CPU, an MPU, or the like) in the imprint apparatus or the like may read a program and execute the program. In this case, the program and a storage medium storing the program are included in the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-150694, filed Aug. 20, 2019, which is hereby incorporated by reference wherein in its entirety.

What is claimed is:

1. An imprinting method of forming a pattern of an imprint material on a substrate using a mold, comprising:
a supply step of supplying the imprint material on the substrate;
a pattern forming step of forming the pattern by bringing a concave and convex pattern of the mold into contact with the imprint material of a predetermined shot region on the substrate after supplying the imprint material; and
a foreign particle pressing step of pressing a foreign particle on a surface of the substrate using a pressing surface of a pressing unit,
wherein the foreign particle pressing step is performed before the pattern forming step, and
wherein, in the foreign particle pressing step, the foreign particle is pressed so that an amount of protrusion from a film of the imprint material is smaller than a film thickness of the imprint material after the pattern forming step.

2. The imprinting method according to claim 1, wherein the foreign particle pressing step is performed again between the foreign particle pressing step and the pattern forming step in accordance with a state of the pressed foreign particle.

3. The imprinting method according to claim 1, wherein the foreign particle pressing step is performed before the supply step, and
in the supply step, the imprint material is supplied on the foreign particle pressed in the foreign particle pressing step.

4. The imprinting method according to claim 1, wherein the foreign particle pressing step is performed after the supply step, and
in the foreign particle pressing step, a pressing process is performed on the foreign particle covered with the imprint material.

5. The imprinting method according to claim 1, further comprising:
a foreign particle detection step of detecting the foreign particle present on the surface of the substrate,
wherein, after the foreign particle is detected in the foreign particle detection step, the foreign particle is pressed.

6. The imprinting method according to claim 5, wherein the foreign particle detection step includes a step of acquiring information regarding at least one of a position and a size of the foreign particle on the substrate and storing the acquired information.

7. The imprinting method according to claim 1, wherein the foreign particle pressing step includes a step of relatively moving the foreign particle and the pressing unit so that the foreign particle and the pressing unit face each other.

8. The imprinting method according to claim 1, wherein the mold is able to form the pattern in a plurality of chip regions with one shot and a size of the pressing surface is a size of one chip region or less.

9. The imprinting method according to claim 1, wherein the pressing surface includes a flat surface or a concave and convex surface configured to press the foreign particle.

10. The imprinting method according to claim 9, wherein, before the foreign particle pressing step, a step of supplying the imprint material or a coating material to the foreign particle is provided.

11. The imprinting method according to claim 10, wherein the coating material has photocurability and a coating material curing step of irradiating the coating material with light is provided after the coating material is supplied to the foreign particle.

12. The imprinting method according to claim 1, wherein, after the foreign particle pressing step, an observation step of observing a surface of the substrate in which the foreign particle is present and an adjustment step of adjusting at least one of an amount of the imprint material in the next supply step and a distribution of the imprint material on the basis of the result of the observation step are provided.

* * * * *